United States Patent
Sato et al.

(10) Patent No.: US 7,838,906 B2
(45) Date of Patent: Nov. 23, 2010

(54) SEMICONDUCTOR DEVICE AND METHOD OF MANUFACTURING THE SAME

(75) Inventors: Ken Sato, Niiza (JP); Nobuo Kaneko, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 17 days.

(21) Appl. No.: 12/244,927

(22) Filed: Oct. 3, 2008

(65) Prior Publication Data

US 2009/0166678 A1 Jul. 2, 2009

(30) Foreign Application Priority Data

Dec. 28, 2007 (JP) .............................. 2007-340972

(51) Int. Cl.
*H01L 29/00* (2006.01)
(52) U.S. Cl. ................. 257/194; 257/183; 257/E21.47; 257/E29.001; 438/60; 438/167; 438/172
(58) Field of Classification Search ............... 257/183, 257/194, E21.47, E29.001; 438/60, 517, 438/167, 172
See application file for complete search history.

(56) References Cited

U.S. PATENT DOCUMENTS

2006/0138457 A1* 6/2006 Otsuka et al. ............... 257/194

FOREIGN PATENT DOCUMENTS

JP 3-3936 1/1991

* cited by examiner

*Primary Examiner*—Davienne Monbleau
*Assistant Examiner*—Farid Khan
(74) *Attorney, Agent, or Firm*—Oblon, Spivak, McClelland, Maier & Neustadt, L.L.P.

(57) ABSTRACT

A semiconductor device 1 includes a substrate 2 having on a main surface thereof a central area and a peripheral area which surrounds the central area and is exposed, a semiconductor layer 4 which is formed on the main surface of the substrate 2, is made of a material harder than the substrate 2, is in the shape of a mesa, and has a steep side over the exposed peripheral area, and an insulating film 12S provided on a side surface of the semiconductor layer 4.

7 Claims, 13 Drawing Sheets

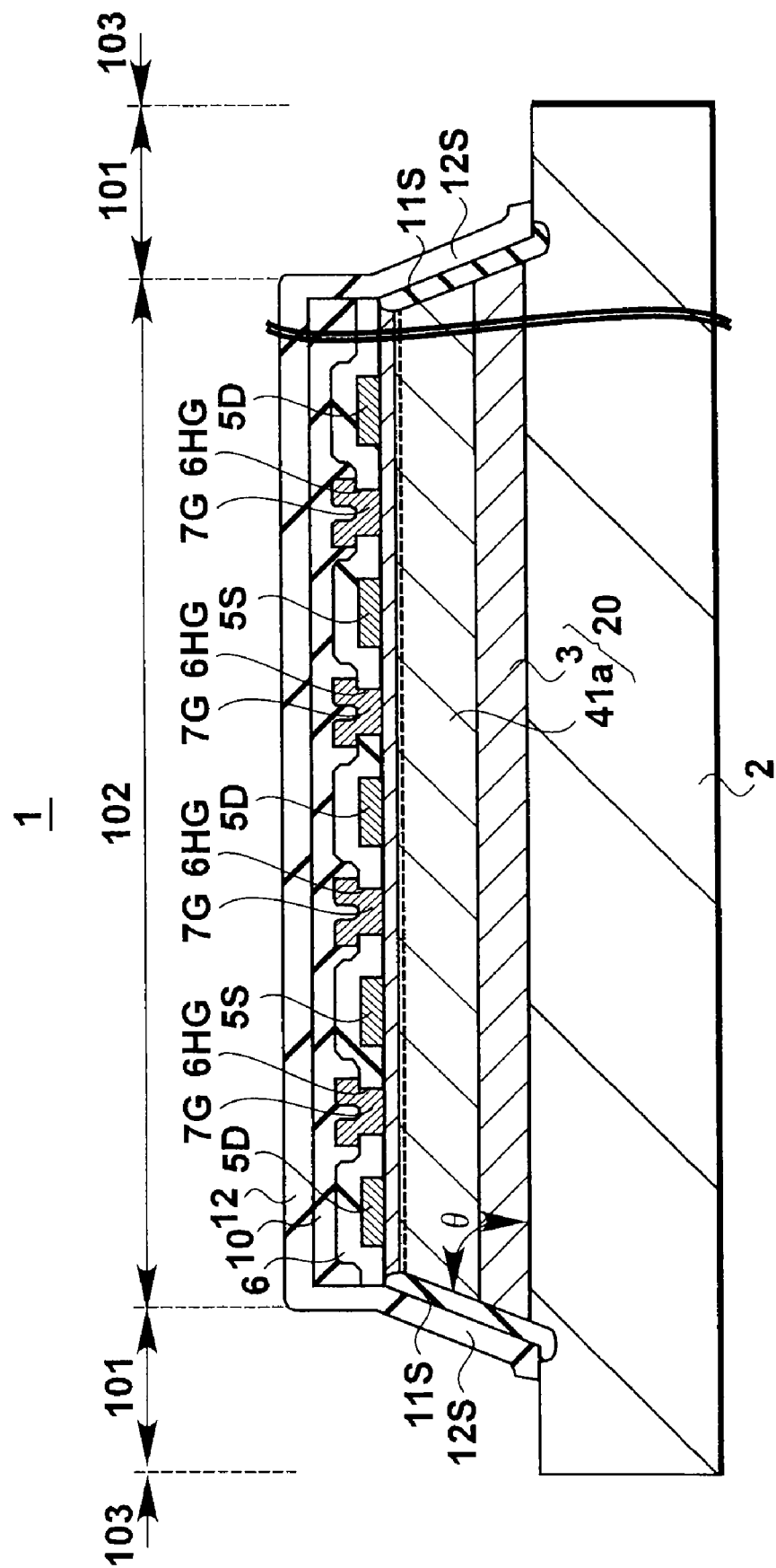

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2007-340.972 filed on Dec. 28, 2007, the entire contents of which is incorporated herein by reference.

BACKGROUND OF THE INVENTION

1. Field of the Invention

This invention relates to a semiconductor device and a method of manufacturing the same, and more particularly relates to a semiconductor device including semiconductor layers which are placed on a substrate and are harder than the substrate, and a method of manufacturing such a semiconductor device.

2. Description of the Related Art

A semiconductor device including a GaN-group electronic device with excellent high frequency performance, more particularly an HEMT (high electron mobility) transistor, is well-known as disclosed in Japanese Patent Publication 1991-003936. The HEMT includes a device function layer, a pair of ohmic (low resistance) electrodes, and a gate electrode.

The device function layer is constituted by a GaN layer and an aluminum-gallium-nitride (AlGaN) layer placed on the GaN layer. With the device function layer, a two-dimensional electron gas layer (2DEG) is produced near an interface between the AlGaN layer and the GaN layer. The 2DEG layer functions as a channel region. The pair of ohmic electrodes are placed on the AlGaN layer of the device function layer, and are used as a source electrode and a drain electrode. The gate electrode is in Schottky junction on the AlGaN layer of the device function layer between the ohmic electrodes, and controls a flow of electrons in the two-dimensional electron gases.

A main semiconductor layer including the device function layer of the HEMT is stacked on the substrate. Usually, the main semiconductor layer is formed on the substrate by the epitaxial growth. A GaN substrate, a silicon-carbide (SiC) substrate or a sapphire substrate is used as the substrate for the main semiconductor layer. The GaN substrate is optimum for the growth of the main semiconductor layer mainly made of a nitride group semiconductor. The SiC or sapphire substrate is used assuming that a buffer layer is present on the substrate side of the main semiconductor layer made of a nitride group semiconductor.

Recently, it is expected that a single-crystal silicon (Si) substrate will be practically used for a wafer in a substrate manufacturing process of the foregoing semiconductor device. The use of the Si substrate is effective in reducing a manufacturing cost, enlarging the substrate, and improving device performance.

The semiconductor devices including the HEMT and the manufacturing method thereof seem to suffer from the following problems.

In order to manufacture a plurality of semiconductor devices (semiconductor chips) at one time, the GaN layer and the AlGaN layer are sequentially placed on a buffer layer which is made of a nitride group semiconductor layer and extends over an Si wafer, thereby obtaining the device function layer. The buffer layer, GaN layer and AlGaN layer undergo the epitaxial growth. Thereafter, the ohmic electrodes and gate electrode are formed on the AlGaN layer. Then, the Si wafer, buffer layer on the Si wafer, GaN layer and AlGaN layer are subject to the scribing (or dicing). The Si wafer is cut and is segmented into semiconductor devices. The GaN layer and AlGaN layer are used as the device function layer in the segmented semiconductor devices.

In the segmenting process, the nitride group semiconductor (i.e. the main semiconductor layer) constituting the buffer layer and the device function layer is however harder than the Si wafer, so that side surfaces of the main semiconductor layer of the segmented semiconductor chips tend to crack. Especially, when a rear surface of the semiconductor device (i.e. a rear surface of the Si wafer) and the source electrode are electrically connected, a high voltage should be kept in a depth direction (longitudinally) of the device function layer. This leads to leakage or collapse of currents because of cracks on the side surface of the device function layer.

SUMMARY OF THE INVENTION

This invention has been contemplated in order to overcome problems of the related art, and is intended to provide a semiconductor device which can prevent cracks on a side surface of a semiconductor layer, and can reduce leakage currents or collapse of currents.

Further, the invention provides a semiconductor manufacturing method which can prevent cracks on side surfaces of semiconductor layers, and boost manufacturing yield.

According to a first aspect of the of the embodiment of the invention, there is provided a semiconductor device which includes: a substrate having on a main surface thereof a central area and a peripheral area which surrounds the central area and is exposed; a semiconductor layer which is formed on the main surface of the substrate, is made of a material harder than the substrate, is in the shape of a mesa, and has a steep side over the exposed peripheral area; and an insulating film provided on a side surface of the semiconductor layer.

In the foregoing semiconductor device, the substrate is preferably made of a IV or III-V group compound semiconductor material, and the semiconductor layer includes nitride group semiconductor layers. Further, the semiconductor layer preferably includes on the side surface thereof an ion implanting layer which suppresses leakage currents. Still further, the semiconductor layer has a hetero junction, and includes a two-dimensional electron gas layer near an interface of the hetero junction.

In accordance with a second aspect of the invention, there is provided a semiconductor device manufacturing method which includes: making a semiconductor forming layer on a main surface of a substrate, the semiconductor forming layer being made of a material harder than the substrate; etching a part of the semiconductor layer in the shape of a mesa until the mesa reaches the main surface of the substrate, and making a plurality of semiconductor layers which are regularly segmented from the semiconductor forming layer in a first direction along the main surface of the substrate and in a second direction which intersects the first direction, the semiconductor layer being in the shape of a mesa and having steep sides; making an insulating film on the side surface of the semiconductor layer; and segmenting the substrate at the partly mesa-etched area of the semiconductor layer. It is preferable that this method further includes implanting impurities into the side surface of the semiconductor layer after making the semiconductor layers, and forming an ion implanting layer on the surface of the semiconductor layer, the ion implanting layer suppressing leakage currents. Further, it is preferable that the substrate is made of a IV or III-V group compound semiconductor material, and the semiconductor forming layer is made in a process where the semiconductor layer including nitride group semiconductor layers is made. Still further, it is preferable that crystalline characteristics of the semiconductor layer at a peripheral area thereof are reduced or alleviated compared at a central area thereof, or the semiconductor layer at the peripheral area is made to have a high withstand voltage while the ion implanting layer is being formed.

This invention provides the semiconductor device which can prevent cracks on side surfaces of semiconductor layer, and can reduce leakage currents or collapse of currents.

Further, the invention provides a semiconductor manufacturing method which can prevent cracks on side surface of semiconductor layer, and boost manufacturing yield.

BRIEF DESCRIPTION OF THE DRAWINGS

FIG. 13 is a cross-sectional view of a semiconductor device in a third embodiment of the invention.

DETAILED DESCRIPTION OF THE INVENTION

Figure 1:
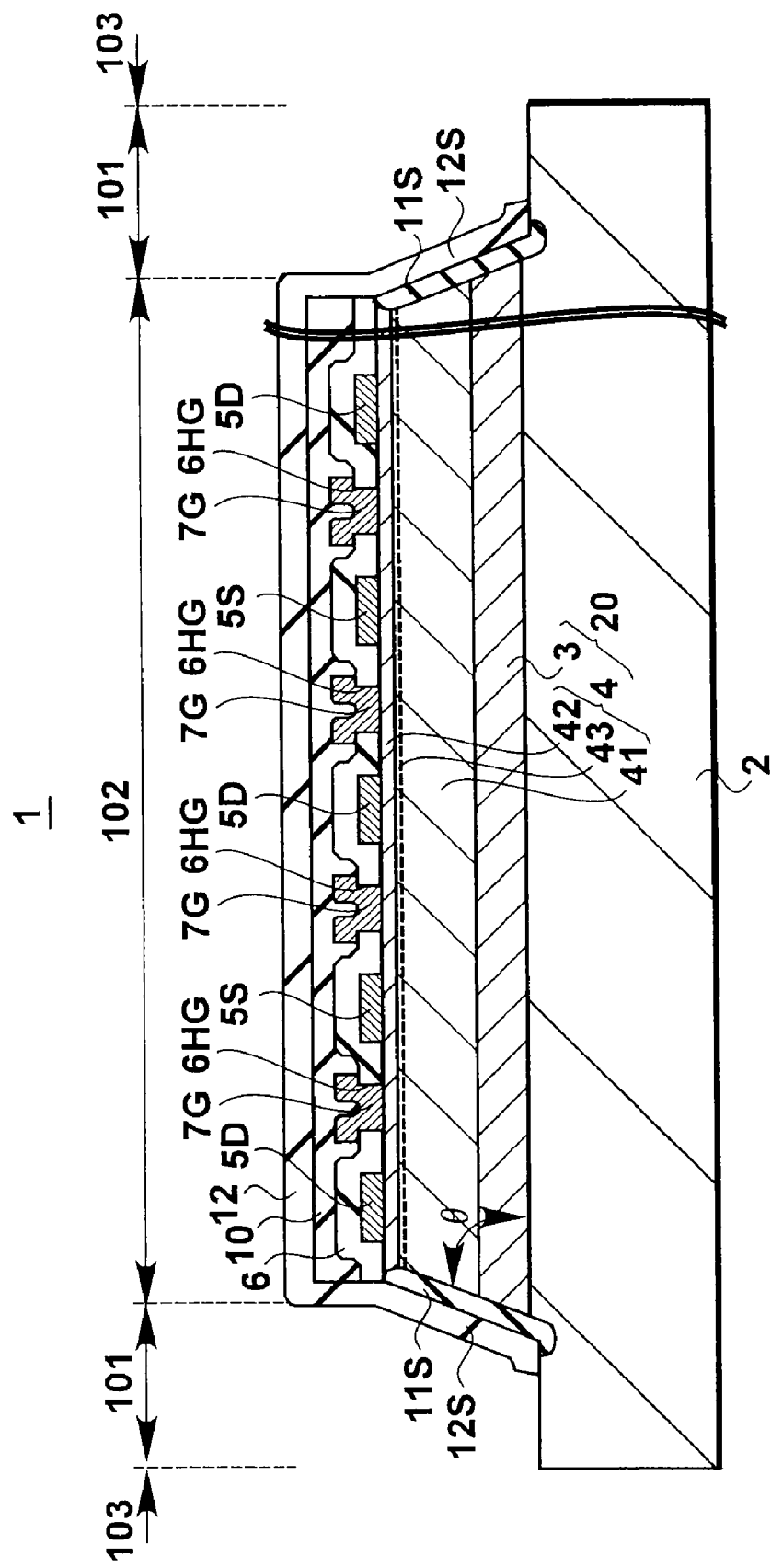
FIG. 1 is a cross-sectional view of an essential part of a semiconductor device in a first embodiment of the invention.

One or more implementations of the present invention will now be described with reference to the attached drawings, wherein like reference numerals are used to refer to like elements throughout, and wherein the illustrated structures are not necessarily drawn to scale. The invention provides a semiconductor device and a method of manufacturing the same.

The invention will be described by means of specific embodiments and applications thereof, numerous modification and variations could be made thereto without departing from the scope of the invention set forth in the claims.

First Embodiment

In a first embodiment, the invention is applied to an electric power semiconductor device including an HMET, and a method for manufacturing such a semiconductor device.

[Configuration of Semiconductor Device]

Figure 2:
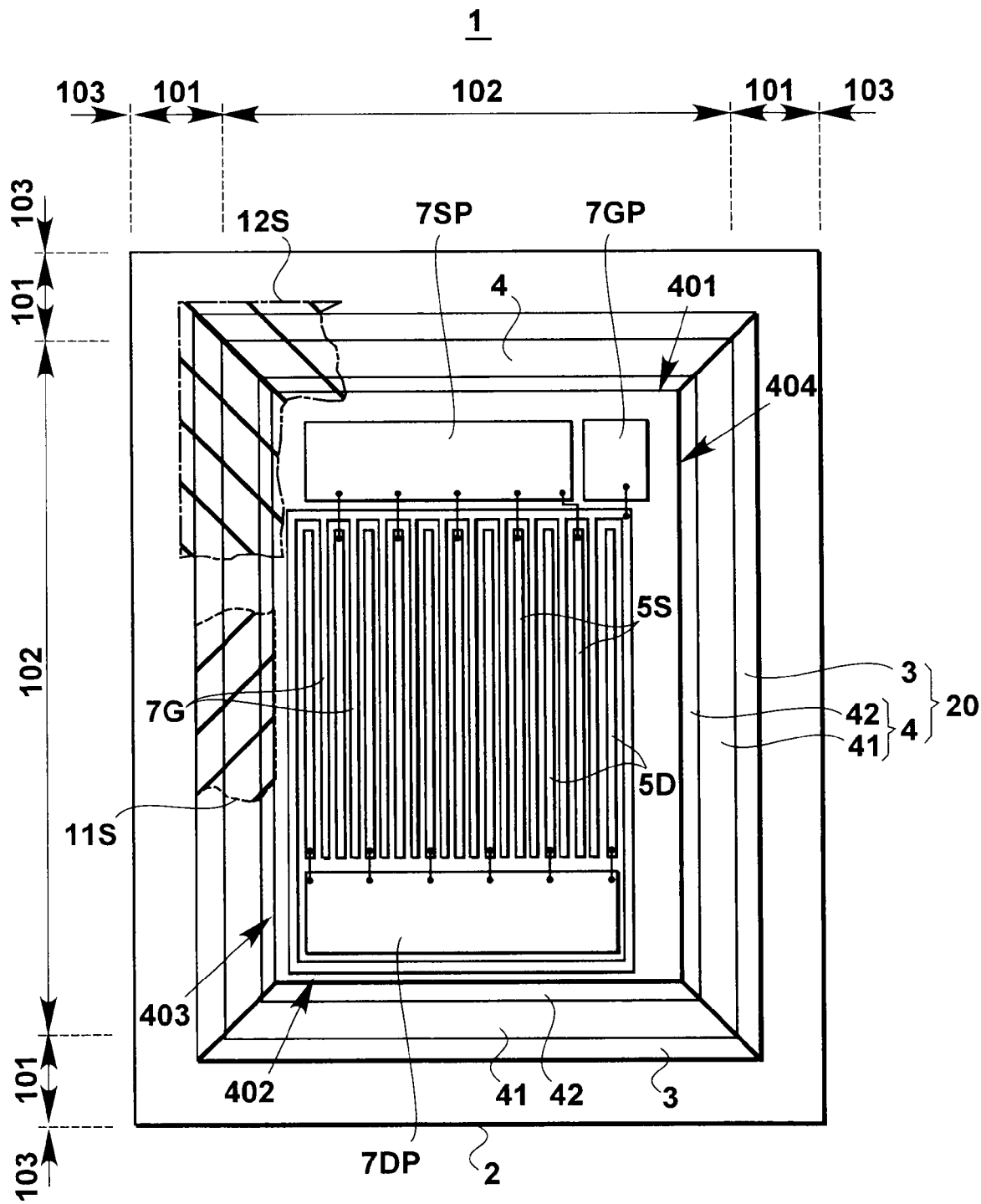
FIG. 2 is a top plan view of the semiconductor device in FIG. 1.

Referring to FIG. 1 and FIG. 2, the electric power semiconductor device 1 includes: a substrate 2 having a central area 102 on its main surface and a peripheral area 101 exposed around the central area 102; a main semiconductor layer (a semiconductor layer) 20 being in the shape of a mesa and sloping on the exposed peripheral area 101 of the substrate 2; and an insulating film 12S on a side surface of the main semiconductor layer 20.

In the first embodiment, the substrate 2 is made of a IV-group semiconductor material, and is practically a single-crystal Si substrate which is 300 μm to 2.0 nm thick, for instance. The Si substrate has been widely applied to technologically established Si electronic devices and methods of manufacturing such Si electronic devices. The use of the Si substrate is effective in reducing a cost of the substrate 2, in enlarging the substrate 2, and in improving the device performance. The substrate 2 shown in FIG. 1 and FIG. 2 is in a segmented state (after the dicing or scribing) in the manufacturing process. The substrate 2 is lengthwise rectangular as shown in FIG. 2. Alternatively, it may be in the shape of a square, a polygon having five or more straight sides and angles, or may have rounded corners. Before the segmentation, the substrate 2 is a wafer (2W).

When the substrate 2 (i.e. a semiconductor chip) measures is 0.3 mm×0.3 mm to 5.0 mm×5.0 mm, the peripheral area 101 has a width of 10 μm to 100 μm between a diced surface of the substrate 2 to the main semiconductor layer 20, and includes a dicing margin for a dicing cutter (or dicing blade), and a margin for preventing cracks in the main semiconductor layer 20 during the dicing.

The main semiconductor layer 20 is placed on a crystalline surface of the substrate 2, i.e. a single-crystal S1 substrate (111), and is in the shape of a mesa. In the first embodiment, the main semiconductor layer 20 has a device function layer 4 on the substrate 2, and a buffer layer 3 interposed between the substrate 2 and the device function layer 4. The main semiconductor layer 20, device function layer 4 and buffer layer 3 are in the shape of the mesa, i.e. they have flat tops and steep sides. In short, a bottom and a top of the main conductor layer 20 are effectively parallel, and the top is smaller than the bottom thereof, as shown in FIG. 1. In this case, an angle θ of gradient of the main semiconductor layer 20 (an angle between the bottom and top of the main semiconductor layer 20) is 10 degrees to 70 degrees, for instance.

In order to secure continuity of crystalline growth of the device function layer 4, the buffer layer 3 is made of a plurality of aluminum-nitride (AlN) layers and a plurality of GaN layers which are alternately stacked. In the first embodiment, a total and final thickness of the buffer layer 3 is designed to be 0.5 μm to 10.0 μm, for instance.

The device function layer 4 is made of a III group nitride semiconductor material which is harder than the Si material of the substrate 2. A typical III group nitride semiconductor materials are denoted by $Al_xIn_yGa_{1-x-y}N$ ($1 \leq x \leq 1$, $0 \leq y \leq 1$, $0 \leq x+y \leq 1$). In the first embodiment, the device function layer 4 includes a GaN layer 41 on an upper surface of the buffer layer 3, and an AlGaN layer 42 on the upper surface of the GaN layer 41, as shown in FIG. 1. GaN is one of most well-known III-V group hexagonal compound semiconductors containing nitride.

In the first embodiment, the GaN layer 41 is designed to be 0.5 μm to 10.0 μm thick, and is actually 2.5 μm to 3.5 μm thick, for instance. The AlGaN layer 42 is designed to be 5.0 nm to 100.0 nm thick, for instance. A two-dimensional electron gas layer 43 is made near a hetero-junction interface between the GaN layer 41 and the AlGaN layer 42 due to spontaneous polarization of the GaN layer 41 and the AlGaN layer 42, and piezopolarization. The two-dimensional electron gas layer 43 functions as a channel region assuring high electron mobility in the HEMT.

The semiconductor device 1 of the first embodiment is provided with the HMET, which includes the device function layer 4 producing the two-dimensional electron gas layer 43, a pair of ohmic electrodes 5S and 5D which are placed on the AlGaN layer 42 of the device function layer 4 and are apart from one another, and a gate electrodes 7G. The gate electrode 7 is placed between each pair of the ohmic electrodes 5S and 5D on the AlGaN layer 42.

The ohmic electrode 5S is used as a source electrode while the ohmic electrode 5D is used as a drain electrode, for instance. The ohmic electrodes 5S and 5D are constituted by titanium (Ti) layers and aluminum (Al) layers which are stack on top of another, for instance. The Ti layers are 10 nm to 50 nm thick, and the Al layers are 100 nm to 1,000 nm thick.

A passivation film 6 is placed on the device function layer 4 except where the gate electrode 7G and the ohmic electrodes 5S and 5D are present. The passivation film 6 is a silicon oxide film, a silicon nitride film, a silicon oxy-nitride (SiON) film, or the like, which is prepared by the plasma chemical deposition (PE-CVD) process. When the silicon oxide film is used, it is 200 nm to 1,000 nm thick, for instance.

The gate electrode 7G is placed on the passivation film 6, and is connected by the Shottkey junction to a surface of the AlGaN layer 42 via a connection hole 6HG in the passivation film 6. The gate electrode 7G is made of a plurality of titanium (Ti) layers, nickel (Ni) layers and gold (Au) layers, all of which are stacked on top of another. For instance, the Ti layers are 50 nm to 500 nm thick, the Ni layers are 100 nm to 500 nm thick, and the Au layers are 0.1 μm to 1.0 μm thick.

Another passivation film 10 is placed on the passivation film 6 extending over the gate electrode 7G and the electrode 7S. The passivation film 10 is a silicon oxide film, a silicon nitride film, a silicon oxy-nitride (SiON) film, or the like, which is prepared by the plasma chemical deposition (PE-CVD) process. The silicon oxide film is 200 nm to 1,000 nm thick, for instance.

Referring to FIG. 2, the substrate 2 and the main semiconductor layer 20 are rectangular. The main semiconductor layer 20 is one size smaller than the substrate 2. An external source terminal 7SP is provided along an upper side 401 at the peripheral area of the main semiconductor layer 20. An external drain terminal 7DP is provided along a lower side 402 at the peripheral area of the main semiconductor layer 20. The lower side 402 faces with the upper side 401.

The external source terminal 7SP is electrically connected to the ohmic electrodes 5S which extend in a direction from the upper side 401 to the lower side 402. The ohmic electrodes 5S are arranged at intervals in a second direction extending from a left side 403 to a right side 404. The right side 404 faces with the left side 403.

The external drain terminal 7DP is electrically connected to the ohmic electrodes 5D which are effectively parallel to the ohmic electrodes 5S and extend at intervals in the first direction. The ohmic electrodes 5S and 5D are alternately arranged.

An external gate terminal 7GP is placed between adjacent ohmic electrodes 5S and 5D, and is electrically connected to the gate electrode 7G extending in the first direction.

In the first embodiment shown in FIG. 1 and FIG. 2, an ion implanting layer 11S and an insulating film 12S are provided on the side surfaces of the buffer layer 3 and device function layer 4, both of which assure relatively high insulation and suppress leakage currents. The ion implanting layer 11S is formed by implanting ions into the side surface of the main semiconductor layer 20. The inventors of this invention infer that the ion implanting layer 11S lowers or alleviates crystalline characteristics, and raises resistance by increasing crystal defects on the side surface of the device function layer 4 and the side surface of the buffer layer 3 compared with the center of the device function layer 4 and the center of the buffer layer 3.

The ion implanting layer 11S is made by ion-implanting nitride ($N_2$) as impurities under conditions of 20 keV to 100 keV energy and a dose amount of $1\times10^{14}$ atoms/cm$^2$. Alternatively, inactive atoms such as argon (Ar) may be used as impurities.

The insulating film 12S functions as a passivation film (protective film) covering the side surfaces of the device function layer 4 and buffer layer 3. The insulating film 12S is made by using a part of a periphery of the passivation film 12 which extends all over the passivation film 10 on the device function layer 4. Alternatively, the insulating film 12S may be made of a material different from the material of the passivation film 12, or may be positioned at a layer different from the passivation film 12. For instance, if made of metal oxide such as titanium-oxide ($TiO_2$) and alumina ($Al_2O_3$), the insulating film 12S inactivates the side surface of the main semiconductor layer 20, and suppresses leakage and collapse of currents.

A bonding hole 12H is made in the passivation film 10 at upper parts of the external source terminal 7SP, external drain terminal 7DP and external gate terminal 7GP on the device function layer 4. The passivation film 10 is made of a silicon-oxide film. Alternatively, the insulating film 12S and the passivation film 10 may be silicon nitride films which are relatively thick as tensile strength is applied, and are easily worked upon. Such silicon-nitride films are 0.3 μm to 2.0 μm thick, for instance.

The ion implanting layer 11S and insulating film 12S are preferably placed near the hetero-junction interface between the GaN layer 41 and AlGaN layer 42 where the two-dimensional electron gas layer 43 is made. Further, it is preferable that the ion implanting layer 11S and the insulating film 12S extend to the side surface of the buffer layer 3, and covers the side surfaces of the buffer layer 3 and the device function layer 4. For instance, when the HEMT is out of operation in the foregoing semiconductor device 1, it is possible to suppress currents leaking from the ohmic electrode 5D (drain electrode) to the ohmic electrode 5S (source electrode) via the buffer layer 3, the substrate 2 and the two-dimensional electron gas layer 43 near the side surface of the device function layer 4.

[Semiconductor Device Manufacturing Method and Structure of Wafer]

The semiconductor device 1 is manufactured as described hereafter. Further, the structure of the wafer is also described.

Figure 3:
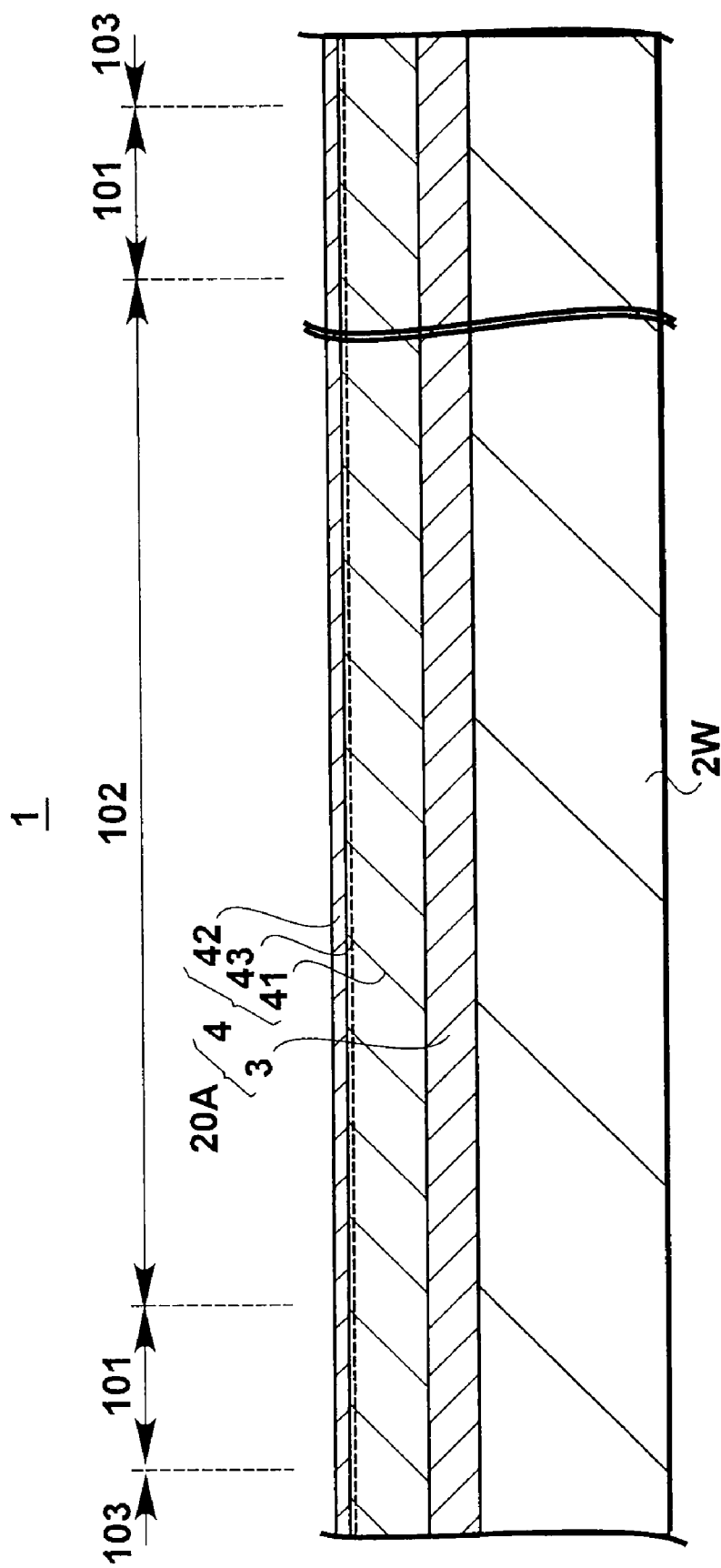
FIG. 3 is a cross-sectional view showing how the semiconductor device in FIG. 1 is made in a first manufacturing process.

A wafer 2W is prepared first of all (refer to FIG. 3). In the first embodiment, the wafer 2W is a single-crystal Si wafer made of a IV group semiconductor material. As shown in FIG. 3, a semiconductor layer forming layer 20A including the buffer layer 3 and the device function layer 4 is formed on the main surface of the wafer 2W using the epitaxial growth process. The term "main surface" of the wafer 2W denotes a crystalline surface of the monocrystal Si wafer (111), or is used in the context of an epitaxial growth layer of the semiconductor forming layer. The "main surface" of the substrate 2 is the same as the main surface of the wafer 2W. The buffer layer 3 extends over the main surface of the wafer 2W, and is made of AlN layers and GaN layers which are alternately stacked. The device function layer 4 is made of GaN layers 41 extending over the buffer layer 3, and the AlGaN layers 42 on the GaN layers 41. The manufacturing conditions and thicknesses of the buffer layer 3 and device function layer 4 are the same as those mentioned above.

Figure 4:
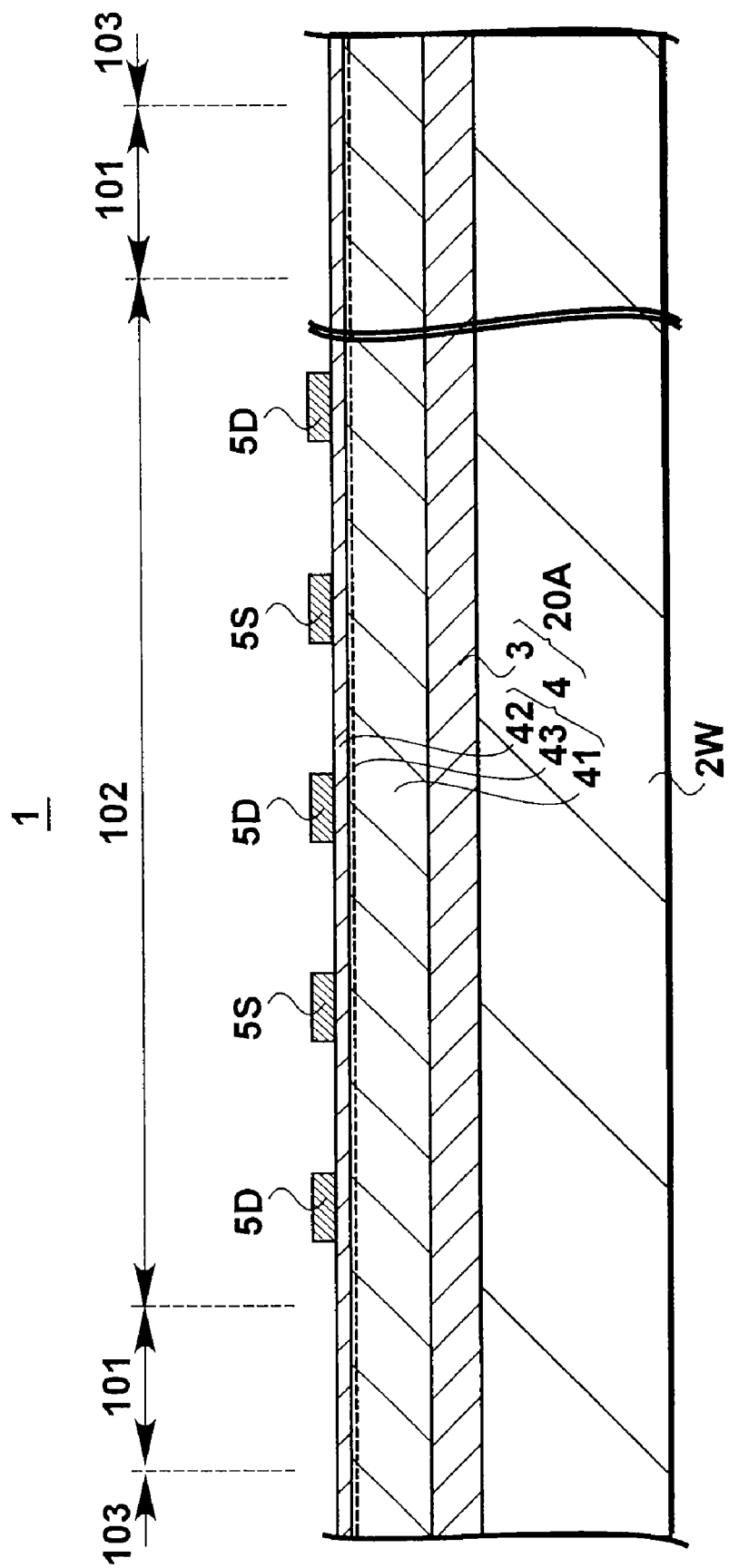
FIG. 4 is a cross-sectional view showing a second manufacturing process.

Referring to FIG. 4, at the area where the device function layer 4 (as well as the buffer layer 3) is formed, the ohmic electrodes 5S and 5D are formed on the AlGaN layer 42 at the top of the semiconductor forming layer 20A. The ohmic electrodes 5S and 5D are made of composite layers of Ti films and Al films on the Ti films. The Ti and Al films are prepared by the sputtering process. Further, the ohmic electrodes 5D and 5S are patterned by an etching process using an ordinary photolithographic mask, or by the lift-off process.

Figure 5:
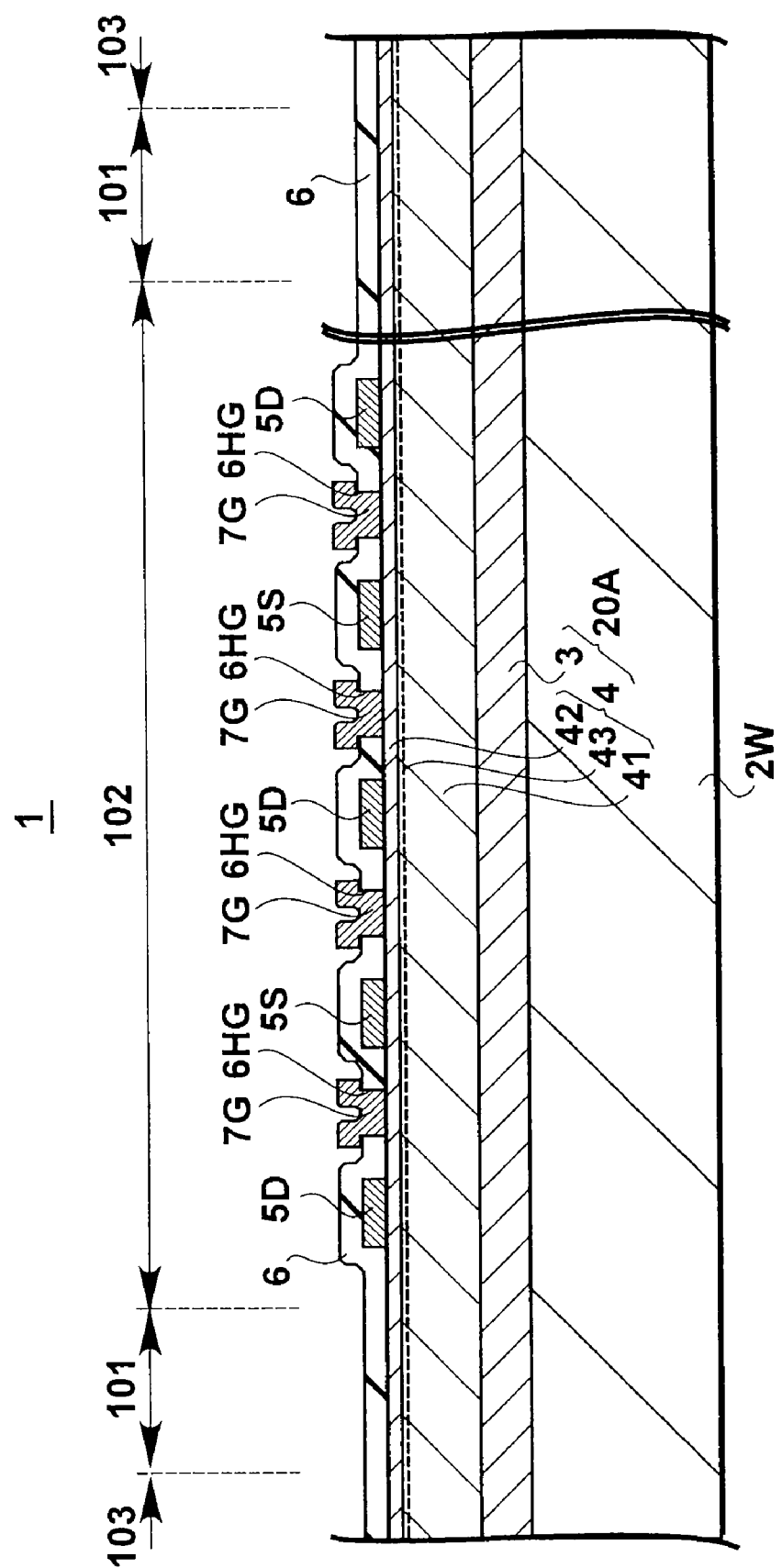
FIG. 5 is a cross-sectional view showing a third manufacturing process.

The passivation film 6 is formed all over the semiconductor forming layer 20A including the ohmic electrodes 5S and 5D (refer to FIG. 5). The passivation film 6 is made of a silicon oxide film prepared by the PE-CVD process. Thereafter, connection holes 6HG of the passivation film 6 are made at the area where the gate electrodes 7G are made (refer to FIG. 5). The connection holes 6HG are made by the etching process using a photolithographic mask.

Referring to FIG. 5, the gate electrode 7G is made on the passivation film 6, and is connected, by the Schottky junction, to the surface of the AlGaN layer 42 of the semiconductor forming layer 20A. The gate electrode 7G is constituted by an Ni film and an Au film placed on the Ni film. The Ni film is made by the sputtering process while the Au film is made by the plating process. The gate electrode 7G is etched and patterned using an ordinary photolithographic mask.

Figure 6:
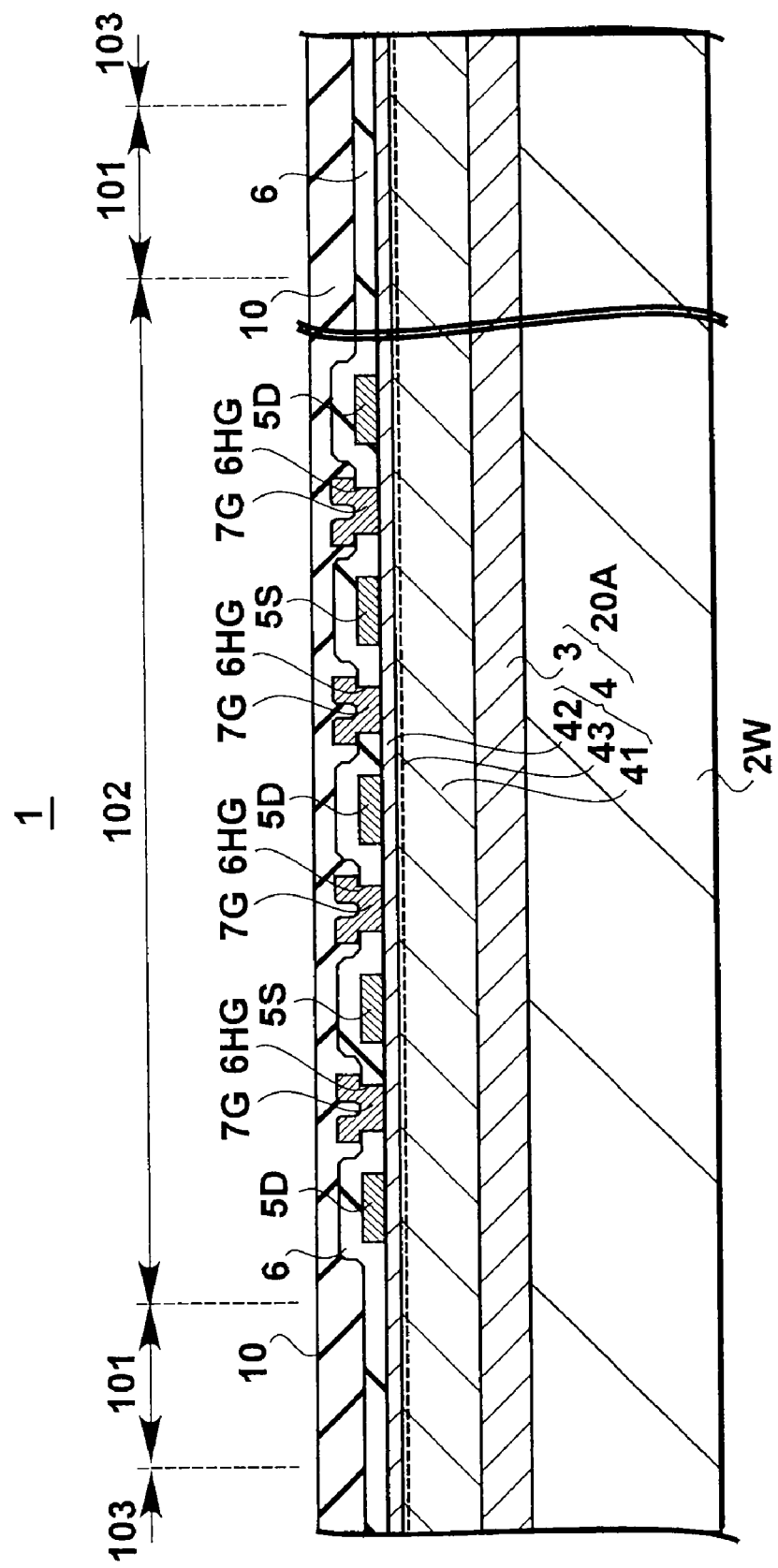
FIG. 6 is a cross-sectional view showing a fourth manufacturing process.

As shown in FIG. 6, the passivation film 10 as well as the semiconductor forming layer 20A is placed all over the gate electrode 7G. The passivation film 10 is a silicon nitride film prepared by the PE-CVD process, for instance.

Figure 11:
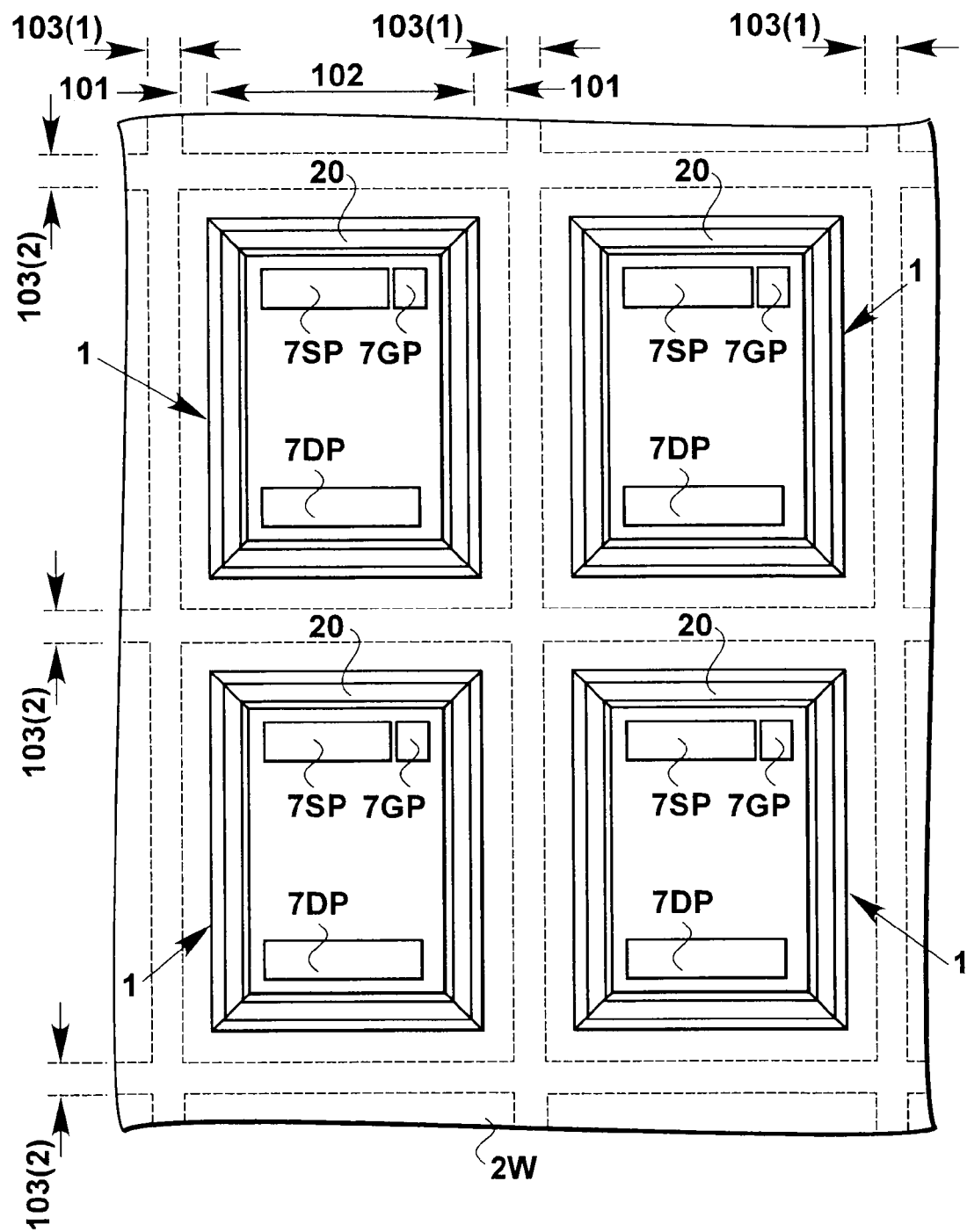
FIG. 11 is a top view of an essential part of a wafer prior to a scribing step in the manufacturing process in the first embodiment.

A mask 20M (shown by dashed lines in FIG. 7) is made all over the passivation film 10. The mask 20M has openings at a part thereof In each opening are formed a dicing area 103 of the wafer 2W (shown in FIG. 7 and FIG. 11) and the peripheral area 101 of the semiconductor device 1. The opening of the mask 20M should be larger than the dicing area 103. Referring to FIG. 11, each dicing area 103 includes a plurality of dicing parts 103(1) and a plurality of dicing parts 103(2). The dicing parts 103(1) extend in the first direction from the upper part to the lower part of the main surface of the wafer 2W, and are arranged at given intervals in the second direction from left to right. The dicing parts 103(2) extend in the first direction, and are arranged at given intervals in the first direction. The mask 20M is practically a photoresist film, for instance.

Figure 7:
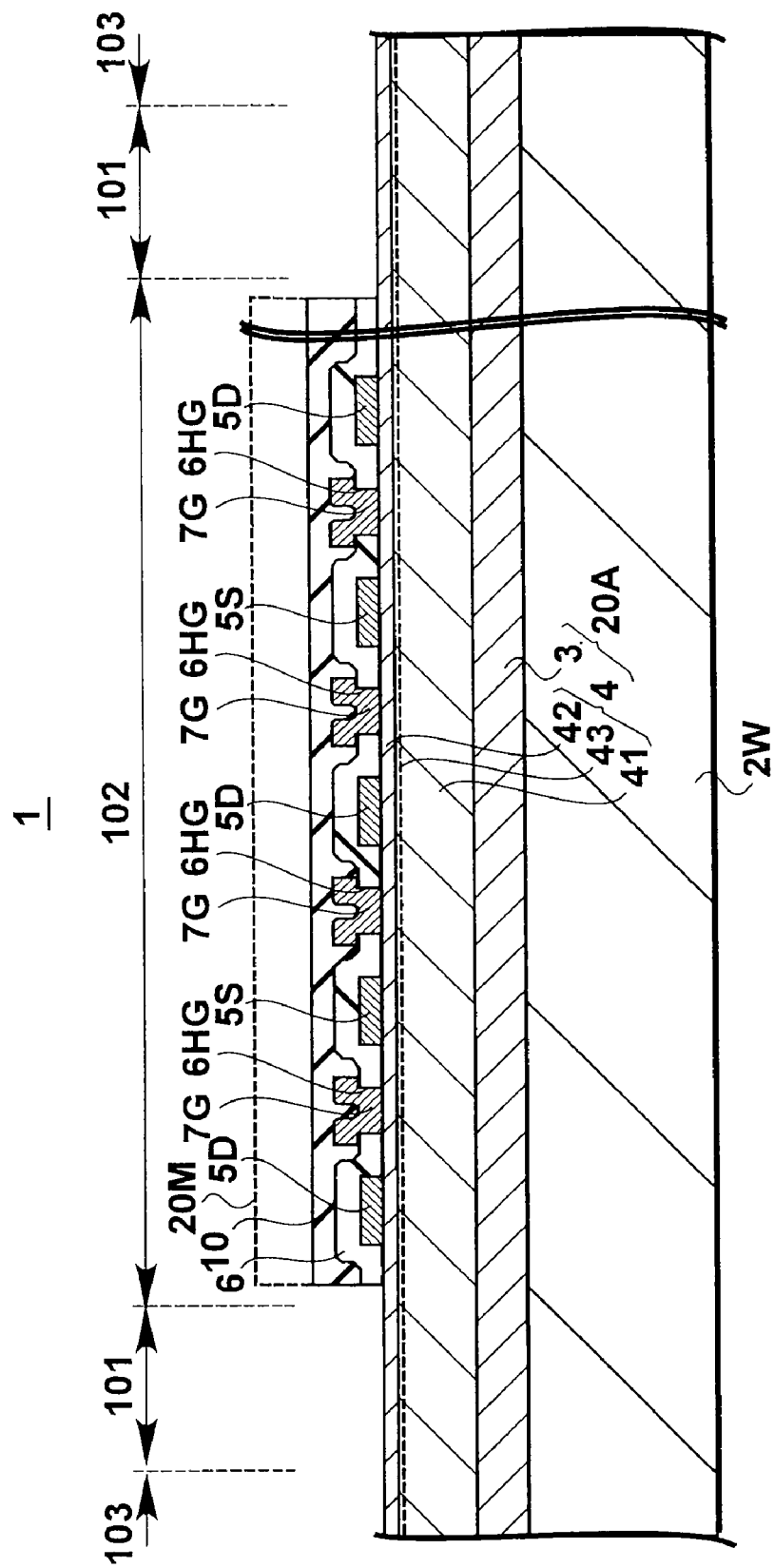
FIG. 7 is a cross-sectional view showing a fifth manufacturing process.

Referring to FIG. 7, the passivation films 10 and 6 which are exposed via the opening of the mask 20M are partially etched out in succession, so that a part (the dicing area 103 and the peripheral area 101) is exposed on the semiconductor forming layer 20A. The wet etching is applied to the foregoing process, for instance.

Figure 8:
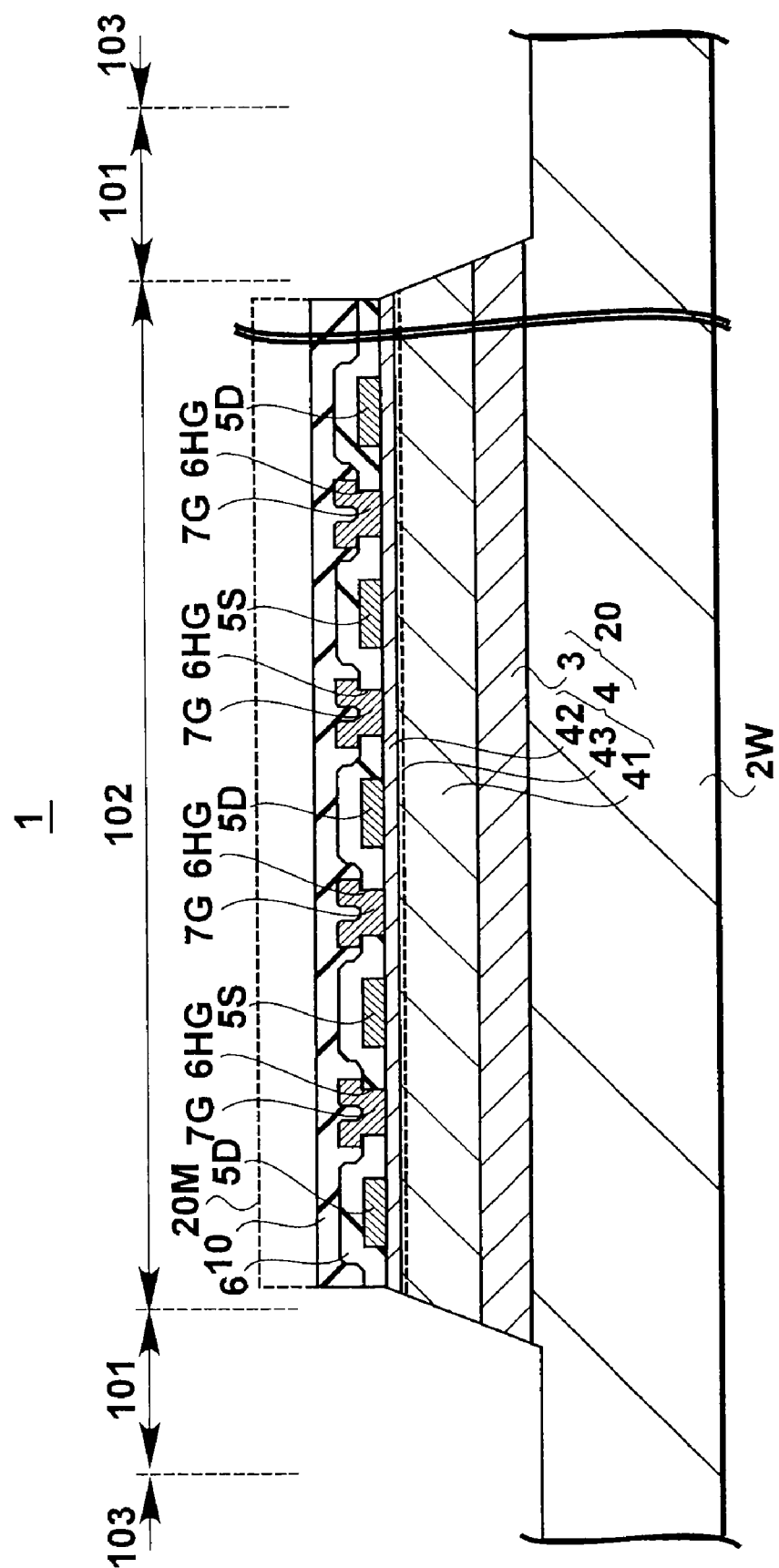
FIG. 8 is a cross-sectional view showing a sixth manufacturing process.

As shown in FIG. 8, the exposed part of the semiconductor forming layer 20A is mesa-etched to the main surface of the wafer 2W by using the mask 20M as it is, thereby obtaining the semiconductor layer 20 which is segmented from the semiconductor forming layer 20A. In other words, the main semiconductor layer 20 includes the device function layers 4 and the buffer layers 3. On the main surface of the wafer 2W, the device function layers 4 and buffer layers 3 are segmented in the first and second directions, and are in the shape of the mesa, i.e. have a flat top and steep sides. The inductively coupled plasma dry etching process (ICP-DE) is practically usable to etch the device function layers 4 and buffer layers 3 in the shape of the mesa. Usually, the mesa-etching is carried out until the main surface of the wafer 2W is exposed. However, some over-etching is acceptable. As a result of the mesa-etching to the surface of the wafer 2W, only the wafer 2W is diced during the segmentation process. Since the side surfaces of the device function layers 4 are apart from the dicing areas 103, no crack will be caused on the side surface of the device function layers 4 because of the segmentation.

Figure 9:
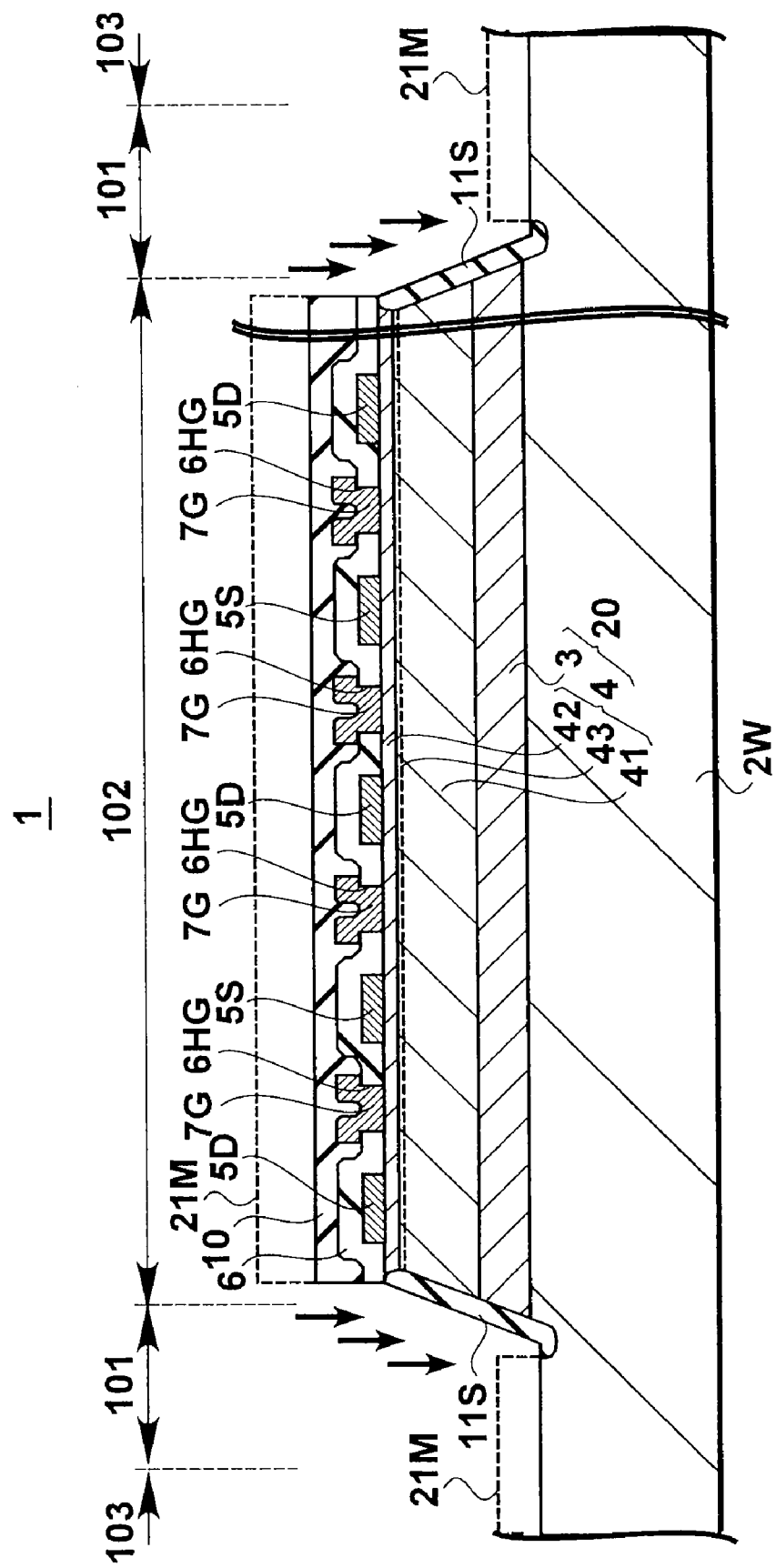
FIG. 9 is a cross-sectional view showing a seventh manufacturing process.

After the mask 20M is removed, a mask 21M (shown by dashed lines in FIG. 9) is formed on the passivation film 10 (see FIG. 9). The mask 21M has an opening via which the side surfaces of the device function layer 4 and the buffer layer 3 are exposed. The mask 21M is practically a photoresist film. As shown in FIG. 9, the ion implanting layer 11S is made on a part of the device function layer 4 and the buffer layer 3. For this purpose, impurities are implanted into side surfaces of the device function layer 4 and the buffer layer 3. In the first embodiment, inactive atoms like $N_2$ or Ar may be practically used as the impurities.

Figure 10:
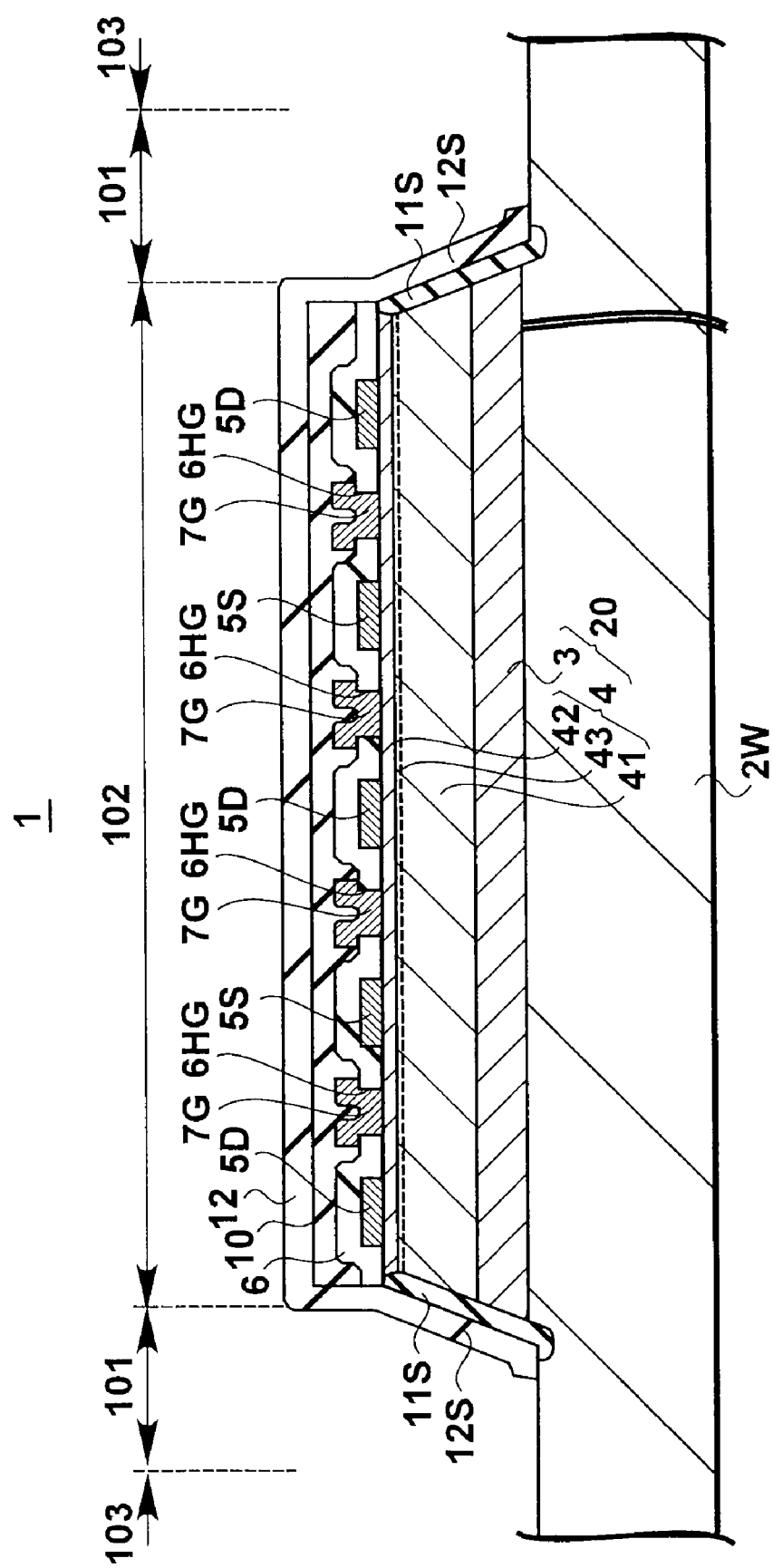
FIG. 10 is a cross-sectional view showing an eighth manufacturing process.

Following the removal of the mask 21M, the passivation film 12 is formed all over the dicing area 103, peripheral area 101, and upper and lower surfaces of the device function layer 4, and wafer 2W (refer to FIG. 10). The passivation film 12 functions as the insulating film 12S and extends along the side surface of the main semiconductor layer 20. The passivation film 10 and the insulating film 12S at a part of the passivation film 10 and may be silicon nitride films which are prepared by the PE-CVD process in such a manner that they have tensile strength. Referring to FIG. 10, on the upper part of the device function layer 4, upper parts of the passivation film 12, external source terminal 7SP, external drain terminal 7DP and external gate terminal 7 are removed, and the bonding opening 12H is made. While making the bonding hole 12H in the first embodiment, the passivation film 12 is also removed from the dicing area 103, so that the main surface of the wafer 2W is exposed. It is not necessary to add a process for removing the passivation film 12. Making of the bonding hole 12H and partial removal of the passivation film 12 are practically executed by the wet etching process. In the first embodiment, the passivation film 12 is removed from an area between the dicing area 103 and a part of the peripheral area 101.

FIG. 11 is the top plan view of the wafer 2W which has undergone the manufacturing process shown in FIG. 10. Specifically, the semiconductor forming area defined by two dicing parts 103(1) adjacent in the second direction and two dicing parts 103(2) adjacent in the first direction are used for making the semiconductor device 1. A plurality of semiconductor forming areas are arranged in the first and second directions. In each semiconductor forming area are arranged the peripheral area 101 extending around the dicing area 103 and the central area 102 surrounded by the peripheral area 103. The main semiconductor layer 20 is placed in the central area 102.

In the dicing area 103, the wafer 2W is segmented, thereby completing the semiconductor device 1 according to the first embodiment.

Features of First Embodiment

In the semiconductor device 1 and the wafer 2W which is an intermediate product of the semiconductor device 1, the peripheral area 101 is exposed, and the semiconductor layer 20 which is harder than the wafer 2W is placed at the central area 102. In other words, in the manufacturing process, the semiconductor forming layer 20A is mesa-etched until it reaches the main surface of the wafer 2W. The segmented semiconductor layer 20 is obtained. The dicing area 103 of the wafer 2W is segmented in order to segment only the wafer 2W. The wafer 2W is apart from the side surface of the main semiconductor layer 20 via a sufficient margin between the dicing area 103 and the peripheral area 101. Therefore, stress resulting from the segmentation is not transmitted to the device function layer 4, which is effective in reducing cracks on the side surface of the device function layer 4.

The main semiconductor layer 20 in the shape of the mesa can improve step coverage of the insulating film 12S. Further, the main semiconductor layer 20 and the insulating film 12S having steep sides can weaken a longitudinal electric field. Still further, the semiconductor layer 20 facilitates making of the ion implanting layer 11S on the side surface of the semiconductor layer 20.

It is therefore possible to suppress increases of leakage currents and collapse of currents caused by cracks, and to improve the high frequency performance of the HEMT installed in the semiconductor device 1. In the first embodiment, when the semiconductor device 1 is packaged in a semiconductor device, a connection between the source side ohmic electrode 5S of the HEMT and the substrate 2 is short-circuited. The source side ohmic electrode 5S and the substrate 2 are used to supply power having a longitudinally high voltage of 600 V, for instance. This is effective in suppressing the leakage and collapse of currents.

In the first embodiment, the ion implanting layer 11S and the insulating film 12S on the side surface of the device function layer 4 of the main semiconductor layer 20 are effective in extensively suppressing the leakage currents and collapse of currents. The semiconductor layer 20 of the first embodiment is provided with the ion implanting layer 11S and the insulating film 12S on the foregoing side surfaces. Alternatively, the semiconductor layer 20 may have only the ion implanting layer 11S or the insulating film 12S.

Second Embodiment

A second embodiment of the invention relates to a modified example of the semiconductor device manufacturing process of the first embodiment.

[Semiconductor Device Manufacturing Method]

In the second embodiment, the semiconductor manufacturing method differs from the manufacturing method shown in FIG. 7 in connection with the first embodiment. Specifically, the passivation films 10 and 6 exposed via the opening of the mask 20M are partially removed in succession by the etching process. Thereafter, the mask 20M is removed.

Figure 12:
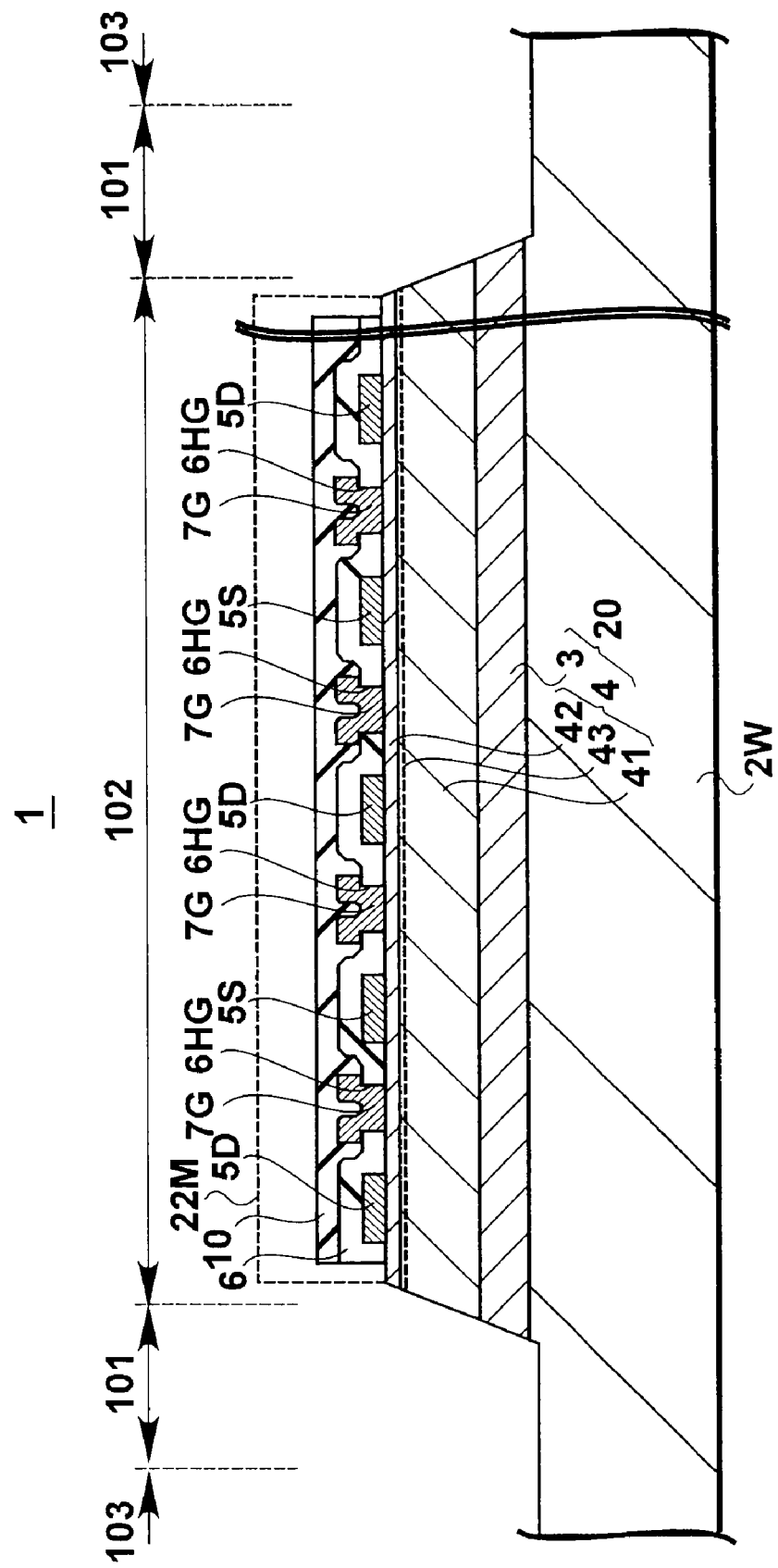
FIG. 12 is a cross-sectional view showing how a semiconductor device is manufactured in a second embodiment of the invention.

A new mask 20M is made on the passivation film 10, and has an opening in the main semiconductor forming layer 20A at the dicing area 103 and the peripheral area 101 (see FIG. 12). The mask 20M is practically a photoresist film, for instance.

Referring to FIG. 12, a part of the main semiconductor forming layer 20A exposed via the mask 20M is mesa-etched until it reaches the main surface of the wafer 2W, thereby making the main semiconductor forming layer 20A including the buffer layer 3 and device function layer 4 which are segmented from the main semiconductor forming layer 20A. The ICP-DE process using a chlorine group gas is practically used for the mesa-etching. Further, the mesa-etching is performed to the surface of the wafer 2W, so that only the wafer 2W is diced in the segmentation process. Since the dicing area 103 is apart from the side surface of the main semiconductor layer 20, the main semiconductor layer 20 is free from cracks resulting from the scribing process.

The processes shown in FIG. 9 and FIG. 10 will be executed, so that the semiconductor device 1 of the second embodiment will be completed.

The semiconductor device 1 and the manufacturing method of the second embodiment are as effective as the semiconductor device 1 and the manufacturing method of the first embodiment.

Third Embodiment

In a third embodiment of the invention, a semiconductor device 1 includes a metal semiconductor field effect transistor (MESFET) in place of the HEMT of the semiconductor device 1 of the first or second embodiment.

Similarly to the semiconductor device 1 of the first embodiment, the semiconductor device 1 (shown in FIG. 13) of the third embodiment includes: a substrate 2 having a central area 102 and a peripheral area 101 exposed around the central area 102; a main semiconductor layer 20 which is made of a material harder than the substrate 2, is placed on a main surface of the substrate 2, is mesa-shaped on the exposed area of the peripheral are 101; and an insulating film 12S on the side surface of the main semiconductor layer 20.

The substrate 2 in the third embodiment is a single-crystal Si substrate made of a IV group semiconductor material. The semiconductor layer 20 includes a buffer layer 3 and a device function layer 41a. The device function layer 41a is harder than the substrate 2, and is made of a nitride group semiconductor material such as an AlGaN layer or InGaN layer. A metal semiconductor field effect transistor (MESFET) is provided on the device function layer 41a.

The MESFET is constituted by: the device function layer 41a where a channel region is formed; a pair of ohmic electrodes 5S and 5D which are provided on the device function layer 41a and are apart from each other; and the gate electrode 7G which is provided on the device function layer 41a and between the ohmic electrodes 5S and 5D.

The semiconductor device 1 of the third embodiment is as effective as the semiconductor device 1 of the first or second embodiment. Further, the semiconductor device manufacturing method of this embodiment is as effective as that of the first or second embodiment.

Other Embodiments

While the invention has been illustrated and described by means of specific embodiments and applications thereof, numerous modifications and variations could be made thereto without departing from the scope of the invention set forth in the claims.

In the foregoing embodiments, the substrate 2 (or wafer 2W) is the single-crystal Si substrate, and the main semiconductor layer 20 is the nitride group semiconductor. Alternatively, the main semiconductor layer 20 may be made of a material which is harder than the substrate 2. For instance, the substrate 2 may be an Si substrate or a GaAs substrate which is one of typical III-V group compound semiconductor materials, and the device function layer 4 of the main semiconductor layer 20 may be made of an SiC device function layer, a nitride group device function layer, and so on.

Further, the Shottoky electrodes are exemplified as the gate electrodes. Alternatively, the gate electrodes may have an MIS gate structure or a recess gate structure which is known as a normally-off-structure. Further, the present invention is not always limited to the semiconductor device including the FET, but is also applicable to semiconductor devices including Shottky diodes or the like.

Still further, the ion implanting layer 11S and the insulating film 12S, which are provided on the side surfaces of the buffer layer 3 and the device function layer 4 or 41a, may be replaced by an insulating film which is made by partly oxidizing the side surfaces of the buffer layer 3 and the device function layer 4 or 41*a*. Further, the buffer layer 3 may be omitted in the present invention.

What is claimed is:

1. A semiconductor device comprising:
a substrate having on a main surface a central area and a peripheral area which surrounds the central area;
a semiconductor layer formed on the main surface of the substrate, the semiconductor layer being made of a material harder than the substrate, and having a side surface above the peripheral area, wherein said side surface is not parallel to the main surface; and
an ion implanting layer that suppresses leakage currents and which is formed directly on said side surface.

2. The semiconductor device according to claim 1, wherein the substrate is made of a IV group or III-V group compound semiconductor material, and the semiconductor layer includes nitride group semiconductor layers.

3. The semiconductor device according to claim 1, wherein the semiconductor layer has a hetero junction, and includes a two-dimensional electron gas layer near an interface of the hetero junction.

4. The semiconductor device according to claim 1, further comprising: an insulating film provided on said side surface.

5. The semiconductor device according to claim 4, wherein on said side surface, an electrode is not present on the insulating film.

6. The semiconductor device according to claim 1, wherein the semiconductor layer is in the shape of a mesa.

7. The semiconductor device according to claim 6, wherein the side surface of the semiconductor layer is a steep side exposed above the peripheral area.

* * * * *